United States Patent [19]

Rostoker et al.

[11] Patent Number: 5,663,086

[45] Date of Patent: Sep. 2, 1997

[54] METHOD OF FORMING A SEMICONDUCTOR DEVICE HAVING CMOS STRUCTURES ON A SEMICONDUCTOR SUBSTRATE

[75] Inventors: Michael D. Rostoker, San Jose; Nicholas F. Pasch, Pacifica, both of Calif.

[73] Assignee: LSI Logic Corporation, Milpitas, Calif.

[21] Appl. No.: 571,345

[22] Filed: Dec. 12, 1995

Related U.S. Application Data

[63] Continuation of Ser. No. 278,573, Jul. 21, 1994, Pat. No. 5,514,616, which is a continuation of Ser. No. 33,213, Mar. 18, 1993, abandoned, which is a continuation-in-part of Ser. No. 750,196, Aug. 26, 1991, Pat. No. 5,217,566.

[51] Int. Cl.$^6$ .................. H01L 21/70; H01L 27/00
[52] U.S. Cl. .................. 438/210; 438/228; 438/229; 438/230; 438/233
[58] Field of Search .................. 437/56, 34, 192, 437/52, 60, 47

[56] References Cited

U.S. PATENT DOCUMENTS 5,023,190  6/1991  Lee et al. .................. 437/56
5,342,802  8/1994  Kubokoya et al. .................. 437/57
5,478,761  12/1995  Komori et al. .................. 437/34

Primary Examiner—Jey Tsai
Attorney, Agent, or Firm—Oppenheimer, Poms, Smith

[57] ABSTRACT

Methods of planarizing one or more layers having an irregular top surface topology in a semiconductor device based on an underlying MOS structure are disclosed. Methods of creating doped wells or regions for the underlying MOS structure are also disclosed, using thick oxide growths on the surface of the substrate to mask implantation of ions into the wells. A technique for creating a pair of adjacent complementary oppositely-doped wells, such as for a CMOS structure, using a thick oxide growths as a mask is also disclosed. One of the methods of planarizing the one or more layers involves depositing, densifying and re-flowing a layer of glass on top of the topological layer. Another method of planarizing the one or more layers involves depositing, densifying and chemical-mechanically polishing the deposited and densified glass, thereby avoiding an additional temperature cycle (i.e., for re-flowing the glass) which would adversely affect underlying diffusions.

61 Claims, 6 Drawing Sheets

METHOD OF FORMING A SEMICONDUCTOR DEVICE HAVING CMOS STRUCTURES ON A SEMICONDUCTOR SUBSTRATE

CROSS-REFERENCE TO RELATED APPLICATIONS

This application is a continuation of U.S. patent application Ser. No. 08/278,573, filed Jul. 21, 1994, now U.S. Pat. No. 5,514,616, which is a continuation of abandoned U.S. patent application Ser. No. 08/033,213 filed Mar. 18, 1993, which is a continuation-in-part of U.S. patent application Ser. No. 07/750,196, filed Aug. 26, 1991, now U.S. Pat. No. 5,217,566.

TECHNICAL FIELD OF THE INVENTION

The invention relates to semiconductor device manufacturing processes and structures and, more particularly, to fabrication of semiconductor devices based on underlying Complementary-Metal-Oxide-Semiconductor (CMOS) structures.

BACKGROUND OF THE INVENTION

Generally, integrated circuit technology is based on the ability to form numerous transistor structures in a single silicon substrate (on a silicon die). Generally, there are two basic types of transistor structures: (1) bipolar and (2) field effect. In bipolar transistors, a 'base' structure is disposed between and in contact with an 'emitter' structure and a 'collector' structure. In field effect transistors (FETs) there are two spaced-apart 'source' and 'drain' structures (or regions, analogous to the 'emitter' and 'collector' of a bipolar transistor). In an FET, a channel is induced in the surface of the silicon region between the source and drain regions, and tunnelling of charges between the source and drain is controlled by a 'gate' element (analogous to the 'base' of a bipolar transistor) disposed atop the channel. In some instances, the gate element of an FET is insulated from the channel, forming a so-called Insulated Gate FET (IGFET).

Generally, the emitter/base/collector or source/drain regions of a transistor structure are formed by implanting ions (dopants), such as phosphorous or boron, into a surface of a semiconductor substrate. An n-type or a p-type region may be formed, depending on the polarity of the dopant. Usually, in order form two dissimilarly doped regions adjacent one another (i.e., for a single transistor structure), it is required to mask the substrate with It is commonly required that several transistor structures are formed on a single semiconductor die, and that the individual transistor structures are packed as closely together (to one another) as possible. This generally requires some sort of isolation structure to be formed between adjacent transistor structures. To this end it is known, for example, to mask portions of the substrate that are intended to be implanted to form elements of transistor structures, and to thermally grow a silicon dioxide structure in un-masked areas of the substrate. One such technique is known as Local Oxidation of Silicon (LOCOS). Such LOCOS structures tend to grow not only above the surface of the substrate, but tend to grow into the substrate as well. The portion of the LOCOS structure that grows above the surface of the substrate is exemplary of a situation that affects nearly every semiconductor device—namely non-planar topology of the top surface of the substrate.

Additional layers and structures formed atop the basic transistor structures, to implement devices such as non-volatile memory (for example), or simply to effect interconnections between many of these structures on a substrate (e.g., on an integrated circuit die), evidently cause the top surface of the substrate to become very irregular (non-planar; topological). Interconnections, for example, typically require several alternating layers of insulating material and conductive material, and vias or plugs through the layers to make contact to other metal layers and to the underlying elements of the transistor structures. When applying subsequent layers, these topological features can present difficulties in obtaining layers of uniform thickness, good coverage at steps, uniform filling of vias, and the like. Hence, it is known to planarize the layers of a semiconductor device at various stages of fabrication.

An irregular topological feature certainly occurs when, for example, a FET gate electrode is formed atop a thin (e.g. 2 nm) layer of insulating material such as oxide and a thicker (e.g., 50 nm) layer insulating material such as nitride (silicon nitride). The gate electrode forms a rather prominent feature which tends to be elevated from the remaining surface of the transistor structure.

Numerous iterations of one or more of the aforementioned transistor structures, or the like, can be replicated and interconnected on an integrated circuit to effect complex circuit functions. In some instances, two neighboring (adjacent) transistors that are intended to be interconnected can share an element (such as a source or drain) with one another, thereby avoiding interconnection through overlying metal layers.

In a typical complementary-metal-oxide-semiconductor (CMOS) transistor structure, two complementary (opposite polarity) transistors are formed adjacent one another. For example, a first area of a substrate is masked (e.g., with photoresist) and another, second adjacent area is doped to form an N-Well in the second area. The first area is prevented from being doped by the mask material overlying the first area. Then the mask is stripped and a second mask is applied over the N-Well. The now-exposed first area is doped to form a P-Well. In this step, the mask overlying the N-Well prevents the N-Well from being doped during the P-doping step. Source and Drain implants for the N-Well and P-Well proceed in much the same manner, typically requiring one of the N- or P-Wells to be masked while the other is being implanted. The Source and Drain regions are typically doped to a polarity opposite to that of the well in which they reside.

Desirable objects of semiconductor design, generally, include minimizing process steps, ensuring reliable fabrication of various structures, and achieving desired functionality. Often, these goals may compete against one another. Hence it is desirable, for a given intended semiconductor design, to implement steps (or a series of steps in an overall fabrication scheme) that can achieve one or more of these objectives, without detracting from another of the objectives. For example, if one layer can serve two functions (e.g., as an insulating layer and as an implant mask), this would generally be considered desirable.

Another factor of concern in semiconductor design is thermal budget. As mentioned above, isolation structures are often formed using a thermal process. Such application of heat to a substrate will also have the effect of diffusing (spreading) out fugitive ionic species (dopants) that have already been implanted into the substrate. While, in some cases, such diffusion of implants is advertent, in other cases it is an unwelcome side effect of other fabrication processes. In either case, any thermal processing of the substrate subsequent to implantation must be accounted for in the design of the process and of the device. As an example, it is known to deposit, densify and re-flow a layer of glass to establish a planar top surface of an in-process substrate, for example so that subsequent layers can reliably be applied. Each of these steps requires a thermal cycle at an elevated temperature. In the case of depositing, densifying and re-flowing a glass layer, which would typically occur after several implants have already been performed, the re-flow step (in particular) places an enormous strain on the thermal budget of the process.

DISCLOSURE OF THE INVENTION

It is an object of the present invention to provide an improved technique for fabricating transistor structures.

It is a further object of the present invention to provide an improved technique for fabricating CMOS structures.

It is a further object of the present invention to provide an improved technique for fabricating transistor structures which will be used as 'precursors' for subsequently formed semiconductor devices.

It is a further object of the present invention to provide an improved technique for effecting planarization at various stages in the fabrication of semiconductor devices.

According to the invention doped wells or regions in a silicon substrate are created using one or more thick oxide growths on the surface of the substrate to mask implantation of ions into the wells. The thick oxide growth(s) are formed after one photoresist masking step. By using the thick oxide growth(s) as an ion implantation mask, additional photoresist masking is avoided, thereby simplifying the manufacturing process.

According to an aspect of the invention, the thick oxide growths are LOCOS structures, which perform an isolation function in a completed semiconductor device.

According to an aspect of the invention, the thick oxide growth(s) are used to create a pair of adjacent complementary oppositely-doped wells, such as for a CMOS structure.

According to an aspect of the invention, a semiconductor device is fabricated, based on an underlying CMOS structure.

According to another aspect of the invention, methods of planarizing one or more topological layers in such semiconductor devices are disclosed.

In one embodiment of planarizing a topological layer, the method includes the application of a sacrificial layer over the topological layer, and etching the sacrificial layer and topological layer at the same rate until the topological layer is planarized.

In another embodiment of planarizing a topological layer, the method involves mechanical or chemical-mechanical polishing of the topological layer.

In another embodiment of planarizing a topological layer, the method involves depositing, densifying and re-flowing a layer of glass on top of the topological layer.

In another embodiment of planarizing a topological layer, the method involves depositing, densifying and chemical-mechanically polishing the deposited and densified glass, thereby avoiding an additional temperature cycle (i.e., for re-flowing the glass) which would adversely affect underlying diffusions.

Other objects, features and advantages of the invention will become apparent in light of the following description thereof.

DETAILED DESCRIPTION OF THE INVENTION

As discussed hereinabove, there are many different ways in which transistor structures can be fabricated, each having its own nuances (advantages and disadvantages). There clearly remains a need for improved transistor structures, as well as for improved processes for fabricating both old and improved transistor structures.

FIGS. 1A-1D show an embodiment of the present invention, illustrating forming a portion 400 of a semiconductor device.

A layer (e.g., 50 nm) 402 of oxide is formed on the surface of an N-well 404 in a substrate by a thermal oxidation process. This layer (PAD LAYER) of oxide is optional.

Figure 1A:
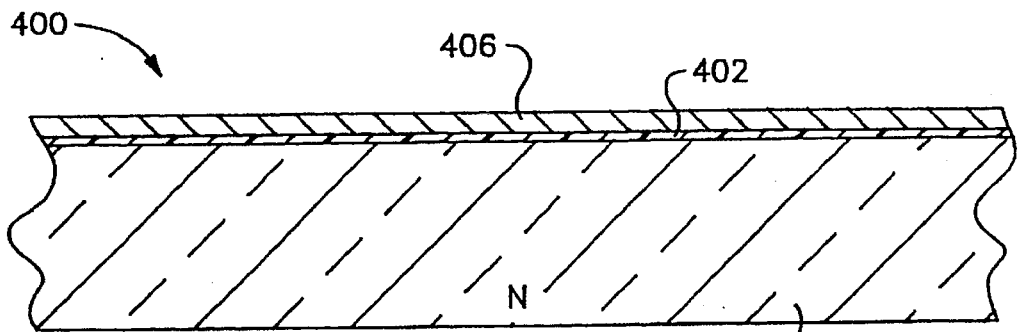
FIGS. 1A-1D are cross-sectional views of a technique for fabricating a MOS element, according to the present invention.

A layer (e.g., 100-140 nm) 406 of nitride is formed atop the (optional) oxide layer 402 by a chemical vapor deposition (CVD) process. The resulting structure is shown in FIG. 1A. (The N-well is formed according to known CMOS (complementary metal oxide semiconductor) techniques.)

Figure 1B:
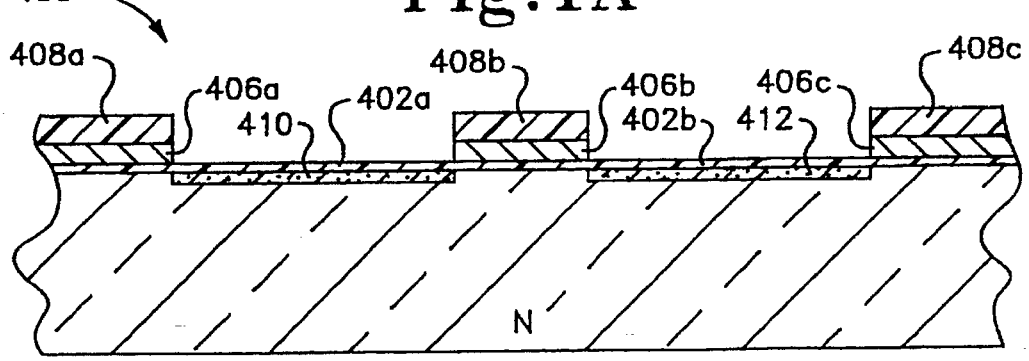

A layer (408) of photoresist is deposited over the nitride layer 406, and is patterned to have segments 408a, 408b and 408c. The photoresist segments are spaced apart, so that source/drain implants (discussed hereinbelow) may be made in the spaces therebetween. The photoresist segments acts as a mask for etching (e.g., plasma etching) away the nitride layer over the well regions, and there remains after such etching nitride segments 406a, 406b and 406c under corresponding photoresist segments. Together, the photoresist and nitride segments acts as a mask for subsequent implantation (or diffusion; e.g., of boron ions) into the substrate, through areas 402a and 402b of exposed thin oxide (402), to form two, relatively shallow, spaced-apart p-type regions 410 and 412 within the surface of the substrate. One of these p-type regions 414/416 serves as the drain of a MOS transistor structure, and the other of the p-type regions serves as the source of the MOS transistor structure. (As a general proposition, the source and drain of a MOS structure are interchangeable.) The structure resulting from these steps is shown in FIG. 1B.

Figure 1C:
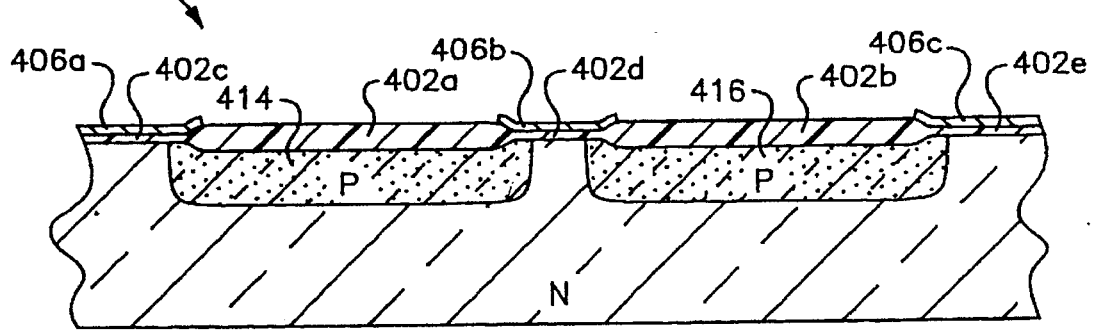

The photoresist is removed, and the substrate is thermally treated in an oxygen environment. The thermal (diffusion) treatment causes the p-type regions 410 and 412 to expand, (laterally) and to thicken. These expanded regions are labelled 414 and 416 in FIG. 1C. The thermal treatment may also cause a very thin incidental layer of oxide (not shown) to form over the nitride. Such incidental thin layer of oxide is readily removed by etching. The structure resulting from these steps is shown in FIG. 1C. As illustrated therein, the nitride segments 406a, 406b and 406c substantially prevent growth of the underlying oxide segments 402c, 402d and 402e. Essentially, the nitride segments is used as a mask to create relatively thick "local oxide" segments 402a and 402b.

The thickness of the thick oxide segments is preferably on the order of 5000–10000 Å (500–1000 nm). The thickness of the thin oxide segments 402c, 402d and 402e, which were masked from oxidation, is preferably on the order of 500–3000 Å (50–300 nm). The thickness of the CVD silicon nitride layer is preferably on the order of 1000–10000 Å.

The nitride layer segments 406a, 406b and 406c are then removed, such as by chemical etching, so that there remains relatively thick (e.g., 750 nm) oxide segments 402a and 402b over the p-type regions 414 and 416, respectively, and so that there remains relatively thin (e.g., 50 nm) oxide segments 402c, 402d and 402e over remaining portions of the substrate. The structure resulting from this step is shown in FIG. 1D.

Figure 1D:
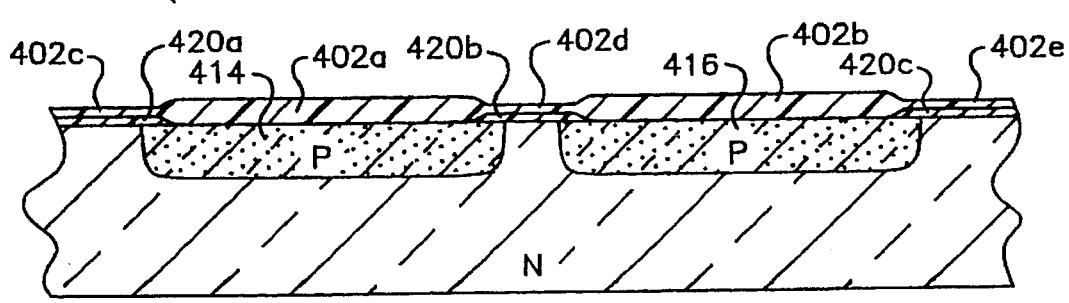

The structure shown in FIG. 1D is then subjected to an implantation process (e.g., with phosphorous ions), during which the thick oxide segments 402a and 402b over the p-type regions 414 and 416. In this manner, an implantation into the substrate in areas (e.g., under oxide segment 402d) between the wells, and in peripheral areas of the wells is effected, forming n-type regions 420a, 420b and 420c, as illustrated. These regions (420a,b,c) serve to prevent the occurrence of parasitic channels between the P-type regions 414 and 416.

As is evident from the structure shown in FIG. 1D, the top surface of the substrate is very irregular. Moreover, the thick oxide segments 402a and 402b exhibit 'bird's beaks' at their lateral extremes (at the transitions to thin oxide). Furthermore, the n-type regions 420a–c exhibit steps at the surface of the substrate. Generally, such irregular topology and stepping of the substrate surface is undesirable, and bird's beaks can also cause some undesirable effects. Nevertheless, as mentioned hereinabove, certain tradeoffs against process complexity may be entirely acceptable.

As will be discussed in greater detail hereinbelow, the structure of FIG. 1D can subsequently be provided with a gate element to form a complete transistor structure to serve as a 'precursor' for a subsequent overlying semiconductor structure.

Figure 2A:
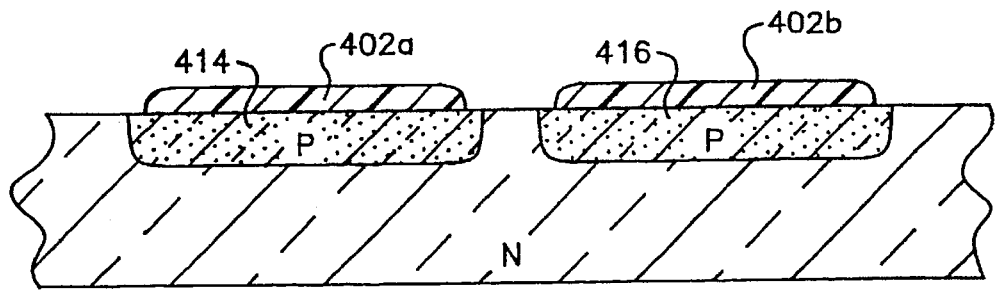
FIGS. 2A-2B are cross-sectional views of a technique for fabricating a MOS element, according to an alternate embodiment of the present invention.
Figure 2B:
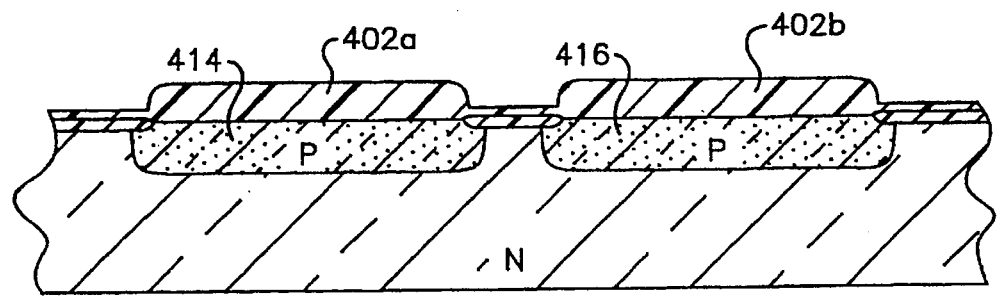

FIGS. 2A AND 2B illustrate another process for forming a portion 500 (similar to 400) of a semiconductor device.

The alternate embodiment of FIGS. 2A and 2B begins at the stage of fabrication illustrated in FIG. 1C. At this point in the process, the nitride segments 406a, 406b and 406c are stripped from the surface of the substrate.

With a suitable etchant, silicon nitride can be stripped from the substrate without removal of any significant quantity of silicon dioxide. The stripping of nitride leaves the underlying oxide (called Stress Relief Oxide, or SRO; not shown) in place. It is possible to select the initial thickness of the SRO so that at the time of nitride strip, the SRO is of optimal thickness for a subsequent ion implant of the diffusion regions. The SRO is thin enough that the ion implantation easily penetrates into the diffusion areas. The thicker "field" oxide is thick enough so that no significant amount of ion implantation penetrates into the field region.

It should be understood that, depending on the remaining thickness of the silicon nitride after field oxidation (growing of the thick oxide segments), the removal of silicon nitride may be optional for subsequent ion implantation.

It should also be understood that the removal of the silicon nitride may be followed by the removal of the SRO, before subsequent ion implantation of the diffusion area. The implantation of the diffusion can take place into the bare silicon diffusion surface. However, a thin (e.g., 200–2000 Å) layer of oxidation on the diffusion area can have a beneficial effect on subsequent ion implantation. Specifically, such a thin oxide (whether grown or deposited) can simultaneously function as an implant channelling inhibitor, and also as a metallic ion absorber.

Next, the thick and thin oxide segments are etched until the thin oxide regions 402c, 402d and 402e are completely removed. The process of etching away the thin oxide segments may be permitted to proceed somewhat beyond complete removal of the thin oxide segments, in an "overetch"). In any event, the thick oxide segments 402a and 402b will be thinned, and the bird's beak features (compare FIG. 1C) will be substantially eliminated.

In the process of removing the thin oxide (SRO film), the thick (field) oxide will also be thinned. It is not widely appreciated that thick field oxide has both desirable and undesirable effects on overall device performance. While it is generally accepted that a thick field oxide beneficially reduces metal line to substrate capacitance (by spacing subsequent metal layers far away from the substrate), it is not generally recognized that such resulting large spacing of overlying multiple metal layers can cause adjacent metal layers to capacitively couple to unacceptable extents. According to the invention, placing the metal layers closer to the silicon surface (by advertently thinning the field oxide) the capacitive coupling between adjacent metal layers can be beneficially reduced, and devices which function better can be fabricated.

Next, new silicon dioxide is grown (e.g., thermally) over the entire surface of the substrate to re-form the thin oxide regions, which are shown in FIG. 2B as oxide segments 502c, 502d and 502e. The thick oxide segments 402a, 402b will evidently become somewhat thicker in this process. Finally, an $n^+$-type dopant (e.g. arsenic) is ion implanted through the re-grown thin oxide regions 502a, 502b and 502c, to form N+ diffusion regions 520a, 520b and 520c (analogous to 420a, 420b and 420c). The end result of this process is shown in FIG. 2B.

Comparing FIG. 2B to FIG. 1D, it can be readily seen that the underside of the oxide in FIG. 2B is substantially more planar than the underside of the oxide in FIG. 1D.

The resulting portions 400 or 500 of a semiconductor structure (both being N-wells structures) can be replicated in an adjacent portion of a substrate, using known CMOS techniques. For example, portions of a substrate destined to become P-Wells can be masked by photoresist while the portions destined to become N-Wells are implanted, and vice-versa. Then, the source/drain regions for these N and P well portions could be implanted using the procedures described hereinabove. (Generally, the processes described above would be reversed, in that n-type source/drain regions would be formed in a P-Well.)

FIGS. 3A–3H illustrate a process for forming a CMOS semiconductor structure 600 having a pair of complementary N and P wells, according to the present invention.

A thin oxide layer 602 is grown on the surface of a silicon substrate 604 of the $N^-$-type. As was the case with the embodiment of FIG. 1A, the underlying 'pad' layer of oxide 602 (compare 402) is optional. The pad oxide layer will, of course, act as a screen during ion implantation, partially (but not fully) blocking the implantation.

Figure 3A:
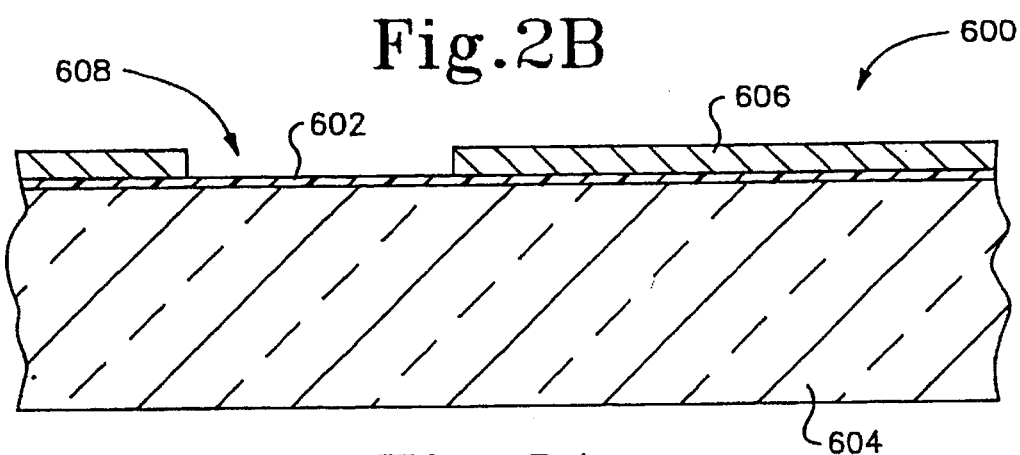
FIGS. 3A-3H are cross-sectional views of an exemplary CMOS structure, formed according to the techniques present invention.

A layer of nitride 606 is deposited atop the oxide layer, and is patterned (using photoresist and etching, as described hereinabove) to have an opening 608 over what is intended to become a P-well (see 612, FIG. 6C) in the substrate. The thin layer of oxide is exposed in the opening 608. The resulting structure is illustrated in FIG. 3A.

Figure 3B:
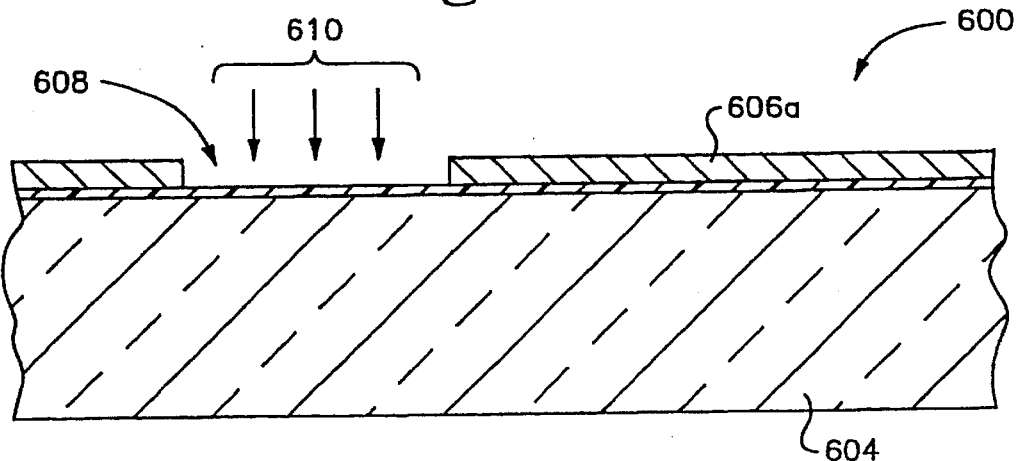

A P-type implant 610 is performed, as indicated by the arrows ("↓↓↓↓↓") in FIG. 3B. In this process step, the nitride segment 606a overlying what is intended to become the N-Well (see 616, FIG. 6E) in the substrate effectively masks the intended N-Well from implantation, while the opening 608 through the nitride layer 606 permits implantation in the P-Well.

Figure 3C:
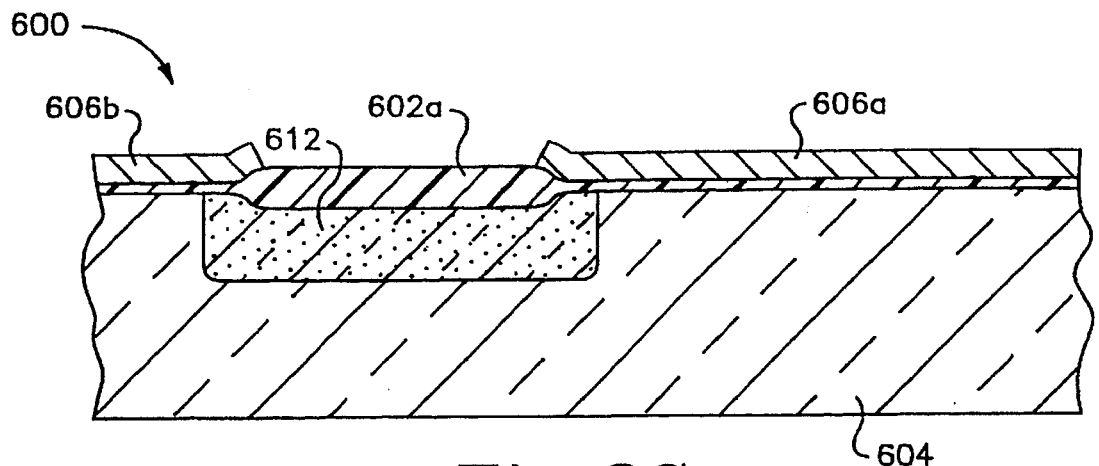
Figure 3D:
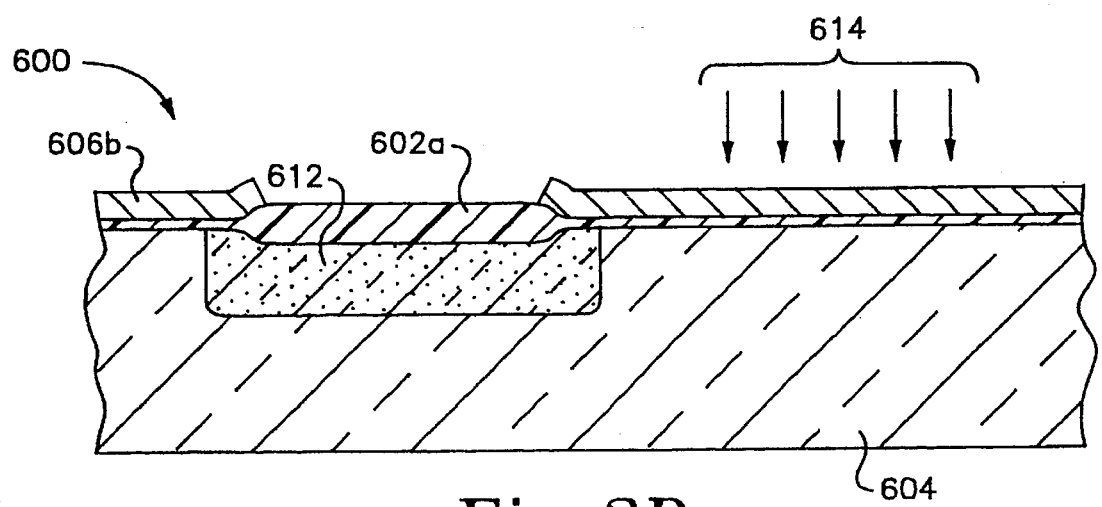

The substrate is then thermally treated in an oxygen furnace to grow (thicken) the exposed oxide segment 602a and to diffuse the P-implant. The resulting structure is shown in FIG. 3C, wherein it can be seen that there is a partially formed P-Well 612. It can also be observed in FIG. 3C that the oxide segment 602a exposed in the opening 608 through the nitride layer 606 has grown substantially, both above and into the top surface of the substrate, and exhibits bird's beaks at its outer ends. It can also be observed in FIG. 3C that the inner ends of the nitride segments 606a and 606b are lifted somewhat by the formation of the bird's beaks. It can also be observed in FIG. 3C that the P-Well 612 has diffused laterally beyond the edges of the overlying opening 608, as well as having diffused into the substrate.

Figure 3E:
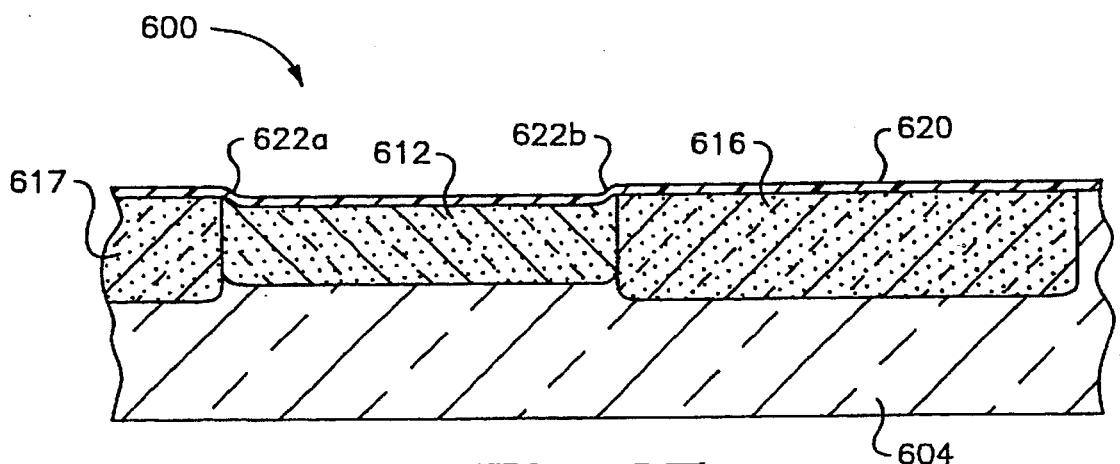

The nitride layer 606 is stripped from the surface of the substrate, using suitable etchants. Then, an N-type implant 614 is performed, as indicated by the arrows ("↓↓↓↓↓") in FIG. 3D. In this process step, the thickened oxide segment 602a overlying the P-Well 612 effectively masks the P-Well from this implant, and a partially formed N-Well is formed under the thin oxide segments 602b. FIG. 3E shows the resulting N-Well 616 after a diffusion step (similar to the previous process step for diffusing the P-Well). In such a thermal diffusion step, the exposed oxide segments 602a and 602b will thicken. They are, however, removed using a suitable etchant, and a new oxide layer 620 is thermally grown over the surface of the substrate. The resulting structure is illustrated in FIG. 3E. While this figure shows the P-Well 612 and complementary N-Well 616 diffused to substantially the same depth, this is somewhat idealized. In practice, the fugitive species (ions) forming the P and N Wells will diffuse at different rates. Often, N-Wells will diffuse deeper into the substrate than P-Wells. In this example, despite the fact that the P-Well is exposed to two diffusion steps (one for diffusing the P-Well and another for diffusing the N-Well), the N-Well may still exhibit a greater depth of diffusion than the P-Well. As can be observed in FIG. 3E, the top surface of the P-Well 612 is somewhat dished, as a result of the stripped away thick oxide segment 602a previously overlying the P-Well. This results in a slightly uneven top surface topology on the substrate, with the N-Well being slightly more elevated than the P-Well, and small steps 622a and 622b at the lateral extremities of the P-Well (at the surface of the substrate). The step 622b is at the interface of the P-Well and the complementary N-Well. (The formation of another N-Well 617 is illustrated in FIG. 3E. This N-Well is the complement of another P-Well which is not illustrated in these figures.)

According to the invention, CMOS or other devices may then be formed in the doped wells of the structure of FIG. 3E. This method of forming such doped wells is advantageous in that it provides self-alignment between the doped wells, while requiring only one photoresist masking step (i.e., to define the nitride mask segments). Such reduced masking requirement is evidently a reliable simplification of the fabrication process which will manifest itself in increased throughput and lower fabrication costs.

Figure 3F:
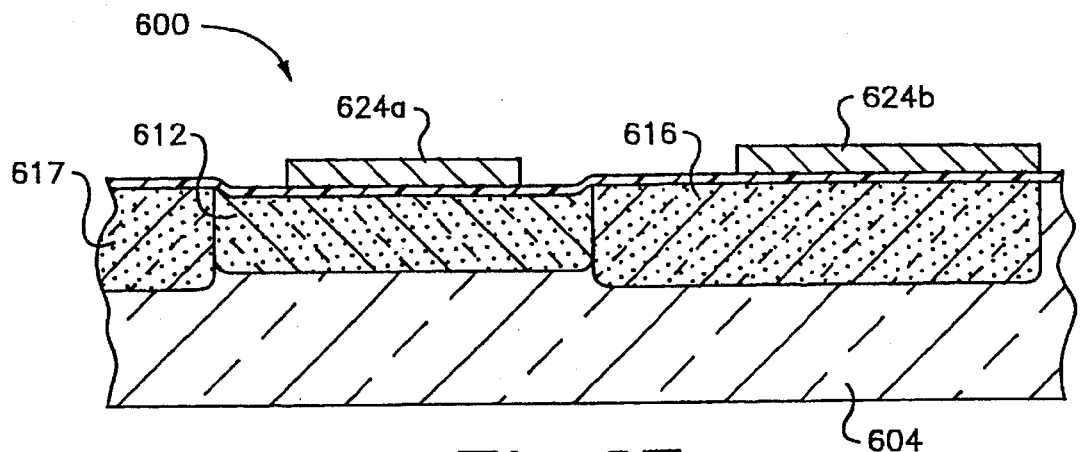

A layer of nitride (624) is deposited, masked and etched on the surface of the substrate, to form a nitride segment 624a overlying and substantially centered over the P-Well 612, and a nitride segment 624b overlying and substantially centered over the N-Well 616. The resulting structure is illustrated in FIG. 3F, wherein it can be observed that the nitride segments 624a and 624b are somewhat shorter in lateral extend than the respective P and N Wells which they overlie.

Figure 3G:
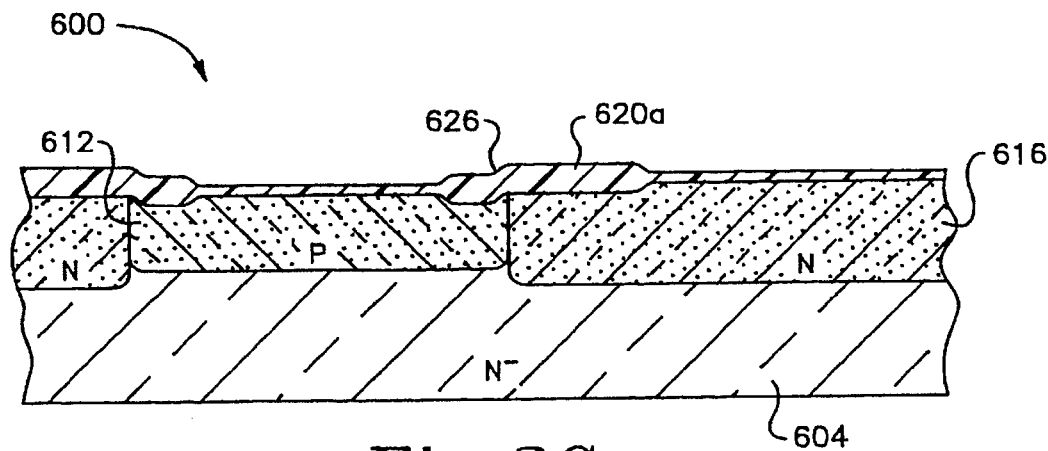

The newly-applied layer of oxide 620 is thermally grown to form a segment 620a of thickened isolation oxide on the surface of the substrate between the P-Well 612 and the complementary N-Well 616. The oxide segment 620a exhibits a step 626 conforming generally to the aforementioned step 622b in the P-Well. The nitride mask segments 624a and 624b are then stripped away. The resulting structure is illustrated in FIG. 3G.

The thickened segment 620a is a Local Oxidation of Silicon (LOCOS) structure. LOCOS is a known technique of forming an oxide isolation structure around a diffusion area, and there are various techniques whereby LOCOS can be formed, including "semi-recessed" and "fully recessed". LOCOS and LOCOS-based semiconductor structures are described in U.S. Pat. Nos. 4,586,238, 4,897,364, 4,903,109 and 4,927,780, incorporated by reference herein. Generally, the resulting LOCOS structure has a prominent portion extending above the substrate surface. It is known to polish the wafer to remove the prominent portion of the LOCOS structure, but this usually involves steps ensuring that the isolation oxide structure does not become gouged out below wafer level, especially if a polish stop (e.g., nitride cap or mask layer) is employed to protect the diffusion areas.

Figure 3H:
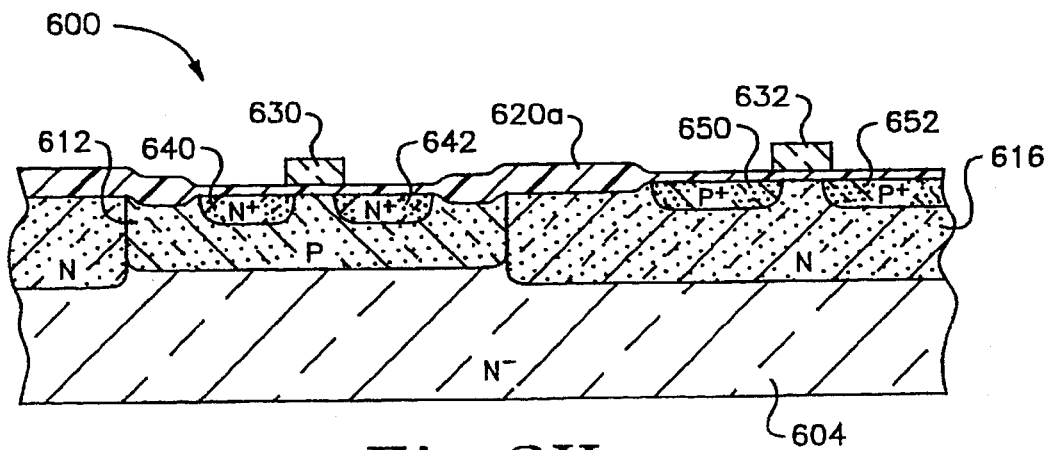

Gate structures (elements) 630 and 632 are formed over the respective P and N Wells, as shown in FIG. 3H. These elements 630 and 632 are preferably formed of polysilicon (poly) and are generally centered over the respective well, bridging to-be-formed source and drain implants. A thin segment of nitride may be interposed between the poly gate element and the underlying oxide.

One of the wells, for example the N-Well 616 is masked by photoresist (not shown), and an $n^+$-type implant is performed, resulting in drain and source implants 640 and 642 in the P-Well 612. The other well is masked (by photoresist, not shown), and a $p^+$-type implant is performed, resulting in drain and source implants 650 and 652 in the N-Well 616. The resulting structure is illustrated in FIG. 3H. Alternatively, the source and drain implants can be formed prior to forming the gate elements 632, using known techniques, or can be formed using the techniques illustrated in FIGS. 1A–1D and 2A–2B.

Figure 4:
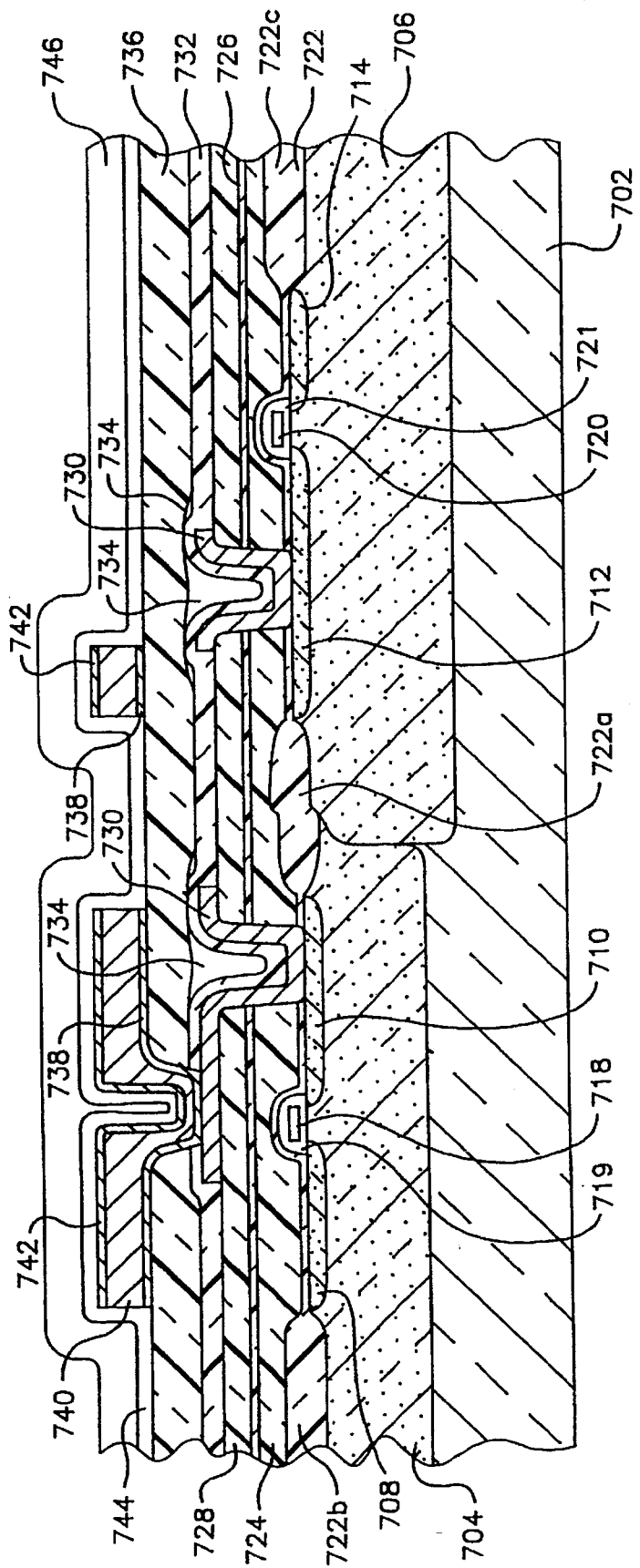
FIG. 4 is a cross-sectional view of a semiconductor device, formed according to the techniques of the present invention.

FIG. 4 illustrates a semiconductor device 700 having an underlying CMOS structure. In this example, a CMOS structure similar to the CMOS structure 600 of FIGS. 3A–3H is used to illustrate an exemplary 'precursor' structure for the device 700.

A CMOS structure is formed in a substrate 702, and includes a P-Well 704, an N-Well 706, drain and source implants 708 and 710 in the P-Well, drain and source implants 712 and 714 in the N-Well, a poly gate electrode 718 bridging the drain and source implants 708 and 710 in the P-Well 704, and a poly gate electrode 720 bridging the drain and source implants 712 and 714 in the N-Well. Suitable dimensions for these elements are: 5.0–7.0 μm for the depth of the P-Well; 7.0–9.0 μm for the depth of the N-Well; 0.15–0.25 μm for the depth of the source/drain diffusions; and 0.10–0.16 μm for the thickness of the poly gates. The gate electrodes, and other poly features of the device 700 are preferably defined by a good quality dry etch technique that will not result in stringers or spurs.

The P-Well portion of the structure 700 forms an N-Channel transistor (NMOS) which, in conjunction with a capacitor structure, can form a dynamic random access memory (DRAM) cell.

A single (as shown) or dual (not shown) sidewall spacer 719 and 721, formed of oxide, is deposited around each of the gate electrodes 718 and 720, respectively, to reduce internal capacitance and hot-carrier effects.

An extremely thin layer of gate oxide (not shown) is formed on the surface of the substrate, at least under the gate electrodes 718 and 720.

A layer 722 of oxide (OXIDE ON DIFFUSION) is formed on the surface of the substrate, which is relatively thin (e.g., 0.10+/−0.02 µm) over the source/drain diffusions, and which exhibits substantial thickening (e.g., 0.3–0.5 µm) in a segment 722a overlying the interface of the P-Well and complementary N-Well. As noted in the discussion of the structure 600, hereinabove, the N-Well may diffuse deeper than the P-Well, as illustrated in this figure. As noted in the discussion of the structure 600, hereinabove, the N-Well is somewhat (e.g., 0.1 µm) higher than the P-Well, and the thick isolation oxide segment 722a (compare 620a) exhibits a step (e.g., 0.1 µm) down (as viewed in this figure) into the P-Well.

The thickened region 722a, and additional thickened regions 722b and 722c (LOCOS structures; compare 620a of FIG. 3G) are formed by a thermal process (oxygen furnace), as described hereinabove, and exhibit some bird's beaks. These bird's beaks can be reduced by using the techniques described above with respect to FIGS. 2A AND 2B.

An intermediate layer 724 of oxide (INTERMEDIATE OXIDE 1), such as a thin layer of densified or undoped oxide on top of a thick layer of BPSG (the BPSG preferably containing 5.0–5.6 wt. percent phosphorous and 4.6–5.2 wt. percent boron), is formed over the CMOS structure, and is on the order of 1.5 µm thick at its thickest points. This layer is quite thinner, on the order of 0.25 µm thick, at its thinnest points above the gate electrodes and above the thickened portions of the oxide on diffusion 722. This layer 724 is suitably applied as a blanket deposition, which will be substantially conformal to the topology of the underlying surface. In this case, the underlying surface is quite irregular. Hence, it is desirable to effect some kind of planarization of the intermediate oxide layer 724, prior to forming subsequent structures on the device.

Figure 5A:
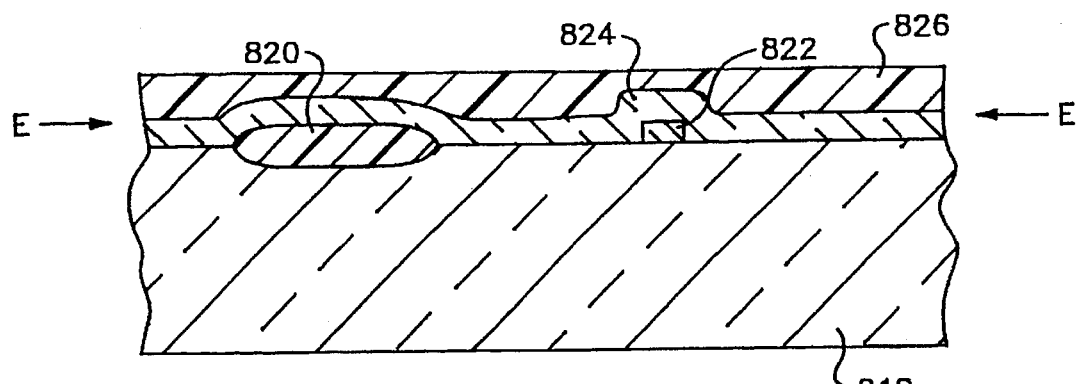
FIGS. 5A-5C are cross-sectional views of alternate embodiments of planarizing techniques, according to the present invention.

According to one embodiment of the invention, illustrated in FIG. 5A, an etching process is used to planarize the intermediate oxide layer 724. A sacrificial layer of low-viscosity material 826 is applied over an irregular layer 824 (compare 724). The layer 824 overlies a gate element 822 and a LOCOS isolation oxide feature 820 on the surface of a silicon substrate 818. In this figure and in the two following figures, the elements 818, 820, 822 and 824 are simply representative of an in-process semiconductor device which exhibits an irregular top surface topology. It is important that the material 826 is flowable (low viscosity), 50 that its top surface will be substantially planar.

The material for the layer 826 is selected for its etch rate, vis-a-vis the etch rate of the underlying layer 824, so that in a given etch process the layers 826 and 824 will etch at substantially the same rate. For example, the material of the layer 826 can be photoresist or polyamid (polyamide). In a subsequent etching step, the overlying layer is etched (such as wet, or chemical etched) until the underlying layer is completely exposed. This endpoint ("see line E—E in the figure") of etching can be detected by the disappearance (absence) of the material of the overlying layer 826 from the etchant. This embodiment suffers from the need to apply, then remove, a sacrificial layer. However, the etching involved, whether chemical or plasma etching, is fairly well controlled and can be selected to proceed at a reasonably high rate.

Figure 5B:
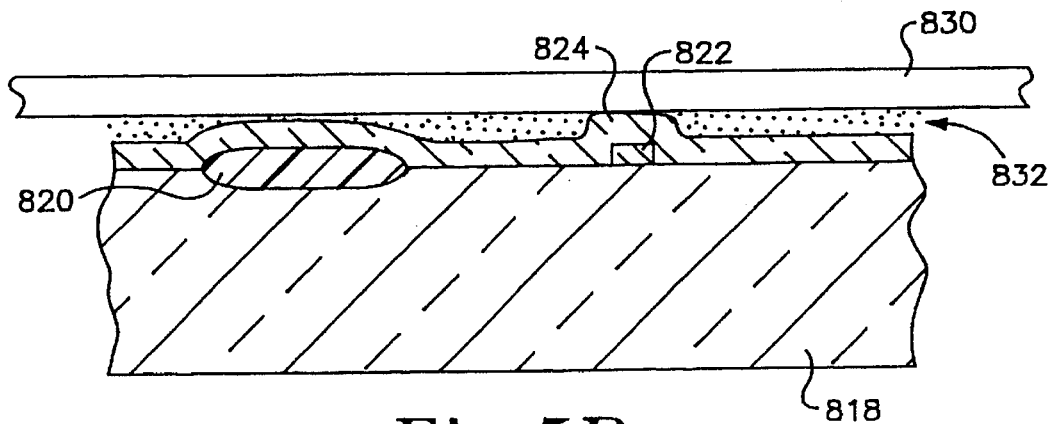

According to an alternate embodiment of the invention, illustrated in FIG. 5B, a chemical-mechanical polishing technique is used to planarize the irregular layer 724. As shown, a rotating polishing pad 830 is urged onto the surface of an irregular layer 824 in the presence of a polishing slurry 832 (indicated by dots "·"). Generally, the endpoint of chemical-mechanical polishing is somewhat more difficult to detect (than in etching, see FIG. 5A), but it can be determined empirically with a high degree of reliability (by polishing and examining test specimens). Another technique for detecting the endpoint of chemical-mechanical polishing is monitoring the load on the motor driving the polishing pad (830), on the basis that the load curve will abruptly even out when the surface being polished is devoid of topological features. In this (and in the previous) figure, the layer 824 is evidently initially (prior to planarizing) sufficiently thick to ensure that a planar top surface can be achieved without exposing the underlying features 820 and 822. One advantage of employing a chemical-mechanical process for planarizing a layer is that it does not require the pre-application of a sacrificial layer (compare the embodiment of FIG. 5A), and avoids heating the substrate as would be required in plasma etching.

Figure 5C:
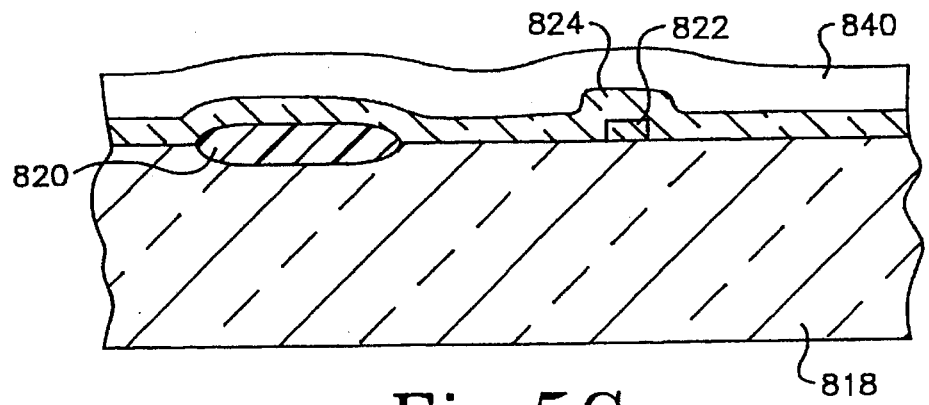

According to yet another embodiment of the invention, illustrated in FIG. 5C, a layer 840 of flowable glass, such as spin-on glass (SOG) or heavily-doped glass, is applied over the layer 824 (724) to planarize the top surface topology of the device (700) at this point in its fabrication. The glass 840 is deposited and densified, both of which require a thermal process. At this stage, there are two possibilities: (1) continuing the thermal processing (at an elevated temperature) to re-flow the glass 840; or (2) chemical-mechanically planarizing the glass (in the manner set forth with respect to FIG. 5B), without the additional thermal re-flow step. The first-option (deposit, densify and re-flow) is well known, and places a significant strain on the thermal budget allocated for the fabrication of the device (e.g., the device 700. It is known that such thermal treatments will cause further diffusion of the implants, which necessitates accommodating such further diffusion by spacing elements farther apart. Since small device geometry is the object of prolonged endeavor, any thermal step subsequent to implanting and diffusing tends to be counter-productive. In a preferred embodiment of this embodiment of the invention (using glass to planarize the layer 724), the glass layer 840 is deposited and densified with temperatures on the order of 700°–800° C. Re-flow of the glass, which is avoided by the invention, requires temperatures on the order of 900°–950° C. In this preferred embodiment, process steps include: (a) depositing a layer of glass over a silicon substrate containing underlying topological features, at a temperature about 700°–800° C.; (b) densifying the glass layer at a temperature of approximately 800° C.; and (c) polishing the glass layer, preferably by chemical mechanical polishing (however, mechanical polishing is also possible); thereby forming a substantially planar glass passivation layer without reflowing the glass layer. In this preferred embodiment of the invention, the glass layer is deposited and densified with a total temperature cycle limited to temperatures required to deposit and densify the glass, and is polished by chemical-mechanical polishing. In these embodiments, there will evidently be vestiges of the glass layer (840) remaining after planarization. This is not undesirable, per se, and provides additional intermediate dielectric isolation between underlying and overlying layers.

Returning to the discussion of FIG. 4, there is shown a layer 726 of densified or undoped oxide formed over the now-planarized intermediate oxide layer 724. A second intermediate layer 728 of oxide, such as BPSG, is formed over the layer 726, and is suitably in the range of from 0.1 to 2.4 µm. These two layers 728 and 726 together comprise an INTERMEDIATE OXIDE 2 layer. Vias are formed through the layers 728, 726, 724 and 722, and are filled with metal, preferably tungsten, on the order of 0.35–0.45 µm thick, to make contact to respective source and drain implants in the N and P wells. Two of these plugs 730 are shown in the figure, for illustrative clarity. These plugs exhibit good sidewall coverage in the vias, but only partially fill the vias, leaving voids, as shown in the figure.

An interlevel layer 732 of oxide (INTERLEVEL OXIDE 1), preferably undoped silicon dioxide, is formed over the tungsten plugs 730 (i.e., over the layer 728 after the tungsten plugs 730 are formed). This layer 732 is substantially conformal to the underlying irregular topology, exhibiting thicknesses ranging from about 0.15 µm (at the thinnest points) to about 0.45 µm (at the thickest points), and exhibits depressions (or troughs) similar to (i.e., conforming substantially to) the voids exhibited by the tungsten plugs 730. Hence, a sufficient amount of filler glass 734 is applied, such as by spin-on techniques, to fill the depressions in the layer 732 so that the resulting top surface is substantially smooth, albeit not extremely planar. As illustrated, the filler glass 734 will also smooth other irregularities (e.g., corners, steps) in the underlying layer 732. Preferably, the tungsten plugs are deposited using a CVD process, and are defined using a dry etch process.

Preferably, INTERLEVEL OXIDE 1 layer 732 is partially planarized prior to deposition of the filler glass 734 and deposition of INTERLEVEL OXIDE 2 736. This partial planarization may be performed using the techniques described with respect to FIGS. 5A–5C.

An interlevel layer 736 of oxide (INTERLEVEL OXIDE 2), preferably undoped silicon dioxide, is applied over the INTERLEVEL OXIDE 1 layer 732 (and over filler glass 734), to a thickness of 0.30–0.40 µm, and vias (one shown) are formed through this layer, and also through the layer 732 and also through any incidental portions of the layer 734 that are aligned with the vias.

A barrier metal (preferably of an alloy containing titanium and/or tungsten) layer 738 is applied, to a thickness of about 0.20–0.30 µm, over the layer 736, and makes contact through the aforementioned vias in the INTERLEVEL OXIDE 2 layer 736 with the underlying tungsten plugs 730 (one such contact shown in this figure, for illustrative clarity). A metal (such as aluminum, or silicon- and copper-doped aluminum; preferably aluminum containing 0.70–0.80 wt. percent silicon and 0.30–0.40 wt. percent copper) filler 740 is applied over the barrier metal layer 738, to a thickness of about 0.6–0.8 µm, and a metal (such as titanium-tungsten) cap layer 742 is applied over the filler 740, as shown, to a thickness of about 0.04–0.06 µm. A dry etch process is preferred for patterning these metal layers.

A first passivation layer 744, such as undoped silicon dioxide, is applied to a thickness of about 0.2–0.4 µm over the metal cap layer 742, and a second passivation layer 746, such as silicon nitride, is applied to a thickness of about 1.0–1.4 µm over the first passivation layer 744.

A die coat (not shown), of polyimide, is suitably applied over the device 700, to a thickness of about 8.0–12.0 µm, to protect against alpha particle-induced leakage.

One skilled in the art to which this invention most nearly pertains will understand that the device 700 can suitably be employed as a unit memory element (memory cell), by connecting the two CMOS structures in series with one another (the source of one of the MOS transistors being connected to the drain of the other MOS transistor). As mentioned hereinbefore, a 'stacked' storage capacitor can be formed over the N-Channel (P-Well) portion of this device 700 to form a DRAM cell.

Evidently, the structure 700 can be replicated numerous times over a semiconductor die to form various 'size' DRAM devices, for example, a 16 megabyte DRAM chip, a 64 megabyte DRAM chip, a 256 megabyte DRAM chip, a 1024 megabyte DRAM chip, or the like. The ultimate 'size' of the device depends on the die size and on the particular sub-micron technology used to fabricate the device. For large size DRAM devices, metal lines (geometries) of 0.6 µm or less (including less than "n" microns, where "n" is 0.5, 0.4, 0.3 or 0.2), and poly geometries of half the metal dimensions would be preferred, to minimize line delays and to increase device density.

What is claimed is:

1. A method of forming a semiconductor device on a semiconductor substrate, comprising the steps of:

forming a silicon nitride layer on a surface of a semiconductor substrate;

patterning the silicon nitride layer to have an opening over a first well region of the substrate and to have a nitride segment over a second well region of the substrate;

implanting a first dopant of a first polarity into the substrate through the opening in the silicon nitride layer into the first well region, the nitride segment effectively shielding implantation of the first dopant into the second well region;

growing a thick first silicon dioxide layer in the opening in the silicon nitride layer over the first well region, the nitride segment inhibiting growth of silicon dioxide over the second well region;

removing the silicon nitride layer;

implanting a second dopant of a second polarity opposite to the first polarity into the substrate, the first silicon dioxide layer effectively shielding implantation of the second dopant into the first well region;

removing the first silicon dioxide layer;

forming gate elements over channel regions in each of the first and second well regions respectively;

forming source and drain regions in the substrate in each of the first and second well regions on opposite sides of the gate elements respectively;

forming a second silicon dioxide layer which exhibits substantial thickening in an area on the surface of the substrate between the first and second well regions and in areas at the peripheries of the first and second well regions, and which is relatively thinner in remaining areas on the surface of the substrate, a top surface of the second silicon dioxide layer exhibiting an irregular topology;

forming a third silicon dioxide layer over the second silicon dioxide layer, a top surface of the third silicon dioxide layer exhibiting an irregular topology;

forming a fourth silicon dioxide layer over the third silicon dioxide layer;

forming first vias through the fourth silicon dioxide layer, through the third silicon dioxide layer, and through the second silicon dioxide layer;

forming metal plugs in the first vias to contact at least portions of the source/drain regions;

forming a fifth silicon dioxide layer over the fourth silicon dioxide layer and over the metal plugs, a top surface of the fifth silicon dioxide layer exhibiting troughs and irregularities;

applying a sixth silicon dioxide layer over the fifth silicon dioxide layer to smooth the troughs and irregularities in the top surface of the fifth silicon dioxide layer;

forming a seventh silicon dioxide layer over the sixth silicon dioxide layer and portions of the fifth silicon dioxide layer which may be exposed through the sixth silicon dioxide layer;

forming second vias through the seventh silicon dioxide layer, through the fifth layer of silicon dioxide, and through any via-aligned portions of the sixth silicon dioxide layer;

applying a barrier metal layer over the seventh silicon dioxide layer, the barrier metal layer filling the second vias;

applying a metal filler over the barrier metal layer;

applying a metal cap over the metal filler; and applying one or more passivation layers over the metal cap and over the seventh silicon dioxide layer.

2. A method as in claim 1, in which:
the first well region is a P-well; and
the second well region is an N-well.

3. A method as in claim 2, in which the P-well is formed to a depth of 5.0 to 7.0 microns in the substrate.

4. A method as in claim 2, in which the N-well is formed to a depth of approximately 7.0 to 9.0 microns in the substrate.

5. A method as in claim 1, in which the source and drain regions are formed to a depth of approximately 0.15 to 0.25 microns in the substrate.

6. A method as in claim 1, in which the gate elements are formed of polysilicon.

7. A method as in claim 6, in which the gate elements are formed to a thickness of approximately 0.10 to 0.16 microns on the substrate.

8. A method as in claim 1, further comprising the step of forming sidewall spacers around the gate elements.

9. A method as in claim 8, in which the sidewall spacers are dual sidewall spacers.

10. A method as in claim 8, in which the sidewall spacers are formed of silicon dioxide.

11. A method as in claim 1, further comprising the step of forming a silicon dioxide gate oxide layer under the gate elements.

12. A method as in claim 1, in which:
said thickened portions of the second silicon dioxide layer are approximately 0.3 to 0.5 microns thick; and
said thin portions of the second silicon dioxide layer are approximately 0.10±0.2 microns thick.

13. A method as in claim 1, in which the third silicon dioxide layer is approximately 1.5 microns thick at its thickest points, and approximately 0.25 microns thick at its thinnest points.

14. A method as in claim 1, in which the third silicon dioxide layer comprises a thin silicon dioxide layer on top of a thick BPSG layer.

15. A method as in claim 14, in which the thin silicon dioxide layer of the third silicon dioxide layer is densified silicon dioxide.

16. A method as in claim 14, in which the thin silicon dioxide layer of the third silicon dioxide layer is undoped silicon dioxide.

17. A method as in claim 14, in which the thick BPSG layer of the third silicon dioxide layer contains approximately 5.0 to 5.6 wt. percent phosphorous, and contains approximately 4.6 to 5.2 wt. percent boron.

18. A method as in claim 1, further comprising planarizing the top surface of the third silicon dioxide layer.

19. A method as in claim 1, in which the fourth silicon dioxide layer is formed of BPSG.

20. A method as in claim 19, in which the fourth silicon dioxide layer has a thickness of approximately 0.1 to 2.4 microns.

21. A method as in claim 1, in which the metal plugs are formed of tungsten.

22. A method as in claim 1, in which the metal plugs are formed to a thickness of approximately 0.35 to 0.45 microns.

23. A method as in claim 1, in which the metal plugs are deposited using a CVD process, and are defined using a dry etch process.

24. A method as in claim 1, in which the sixth silicon dioxide layer is formed of filler glass.

25. A method as in claim 1, in which the fifth silicon dioxide layer is undoped silicon dioxide.

26. A method as in claim 1, in which the fifth silicon dioxide layer has a thickness ranging from approximately 0.15 microns at its thinnest points to approximately 0.45 microns at its thickest points.

27. A method as in claim 1, further comprising the step of partially planarizing the fifth silicon dioxide layer prior to applying the sixth silicon dioxide layer.

28. A method as in claim 1, in which the seventh silicon dioxide layer is undoped silicon dioxide.

29. A method as in claim 1, in which the seventh silicon dioxide layer has a thickness of approximately 0.30 to 0.40 microns.

30. A method as in claim 1, in which the barrier metal layer is applied to a thickness of approximately 0.20 to 0.30 microns.

31. A method as in claim 1, in which the barrier metal layer is formed of an alloy containing titanium and tungsten.

32. A method as in claim 1, in which the barrier metal layer makes contact, through the second vias, with at least a portion of the metal plugs.

33. A method as in claim 1, in which the barrier metal layer is patterned with a dry etch process.

34. A method as in claim 1, in which the metal filler is applied to a thickness of approximately 0.6 to 0.8 microns.

35. A method as in claim 1, in which the metal filler is formed of aluminum.

36. A method as in claim 1, in which the metal filler is formed of doped aluminum.

37. A method as in claim 36, in which the aluminum is doped with silicon.

38. A method as in claim 36, in which the aluminum is doped with copper.

39. A method as in claim 36, in which the aluminum is doped with copper and aluminum.

40. A method as in claim 39, in which the aluminum is doped with approximately 0.70 to 0.80 wt. percent silicon and with approximately 0.30 to 0.40 wt. percent copper.

41. A method as in claim 1, in which the metal filler is patterned with a dry etch process.

42. A method as in claim 1, in which the metal cap is applied to a thickness of approximately 0.04 to 0.06 microns.

43. A method as in claim 1, in which the metal cap is formed of an alloy containing titanium and tungsten.

44. A method as in claim 1, in which the metal cap is patterned with a dry etch process.

45. A method as in claim 1, in which the one or more passivation layers comprise:

an eighth silicon dioxide layer; and a second silicon nitride layer overlying the eighth silicon dioxide layer.

46. A method as in claim 45, in which the eighth silicon dioxide layer is applied to a thickness of approximately 0.2 to 0.4 microns.

47. A method as in claim 45, in which the second silicon nitride layer is applied to a thickness of approximately 1.0 to 1.4 microns.

48. A method as in claim 1, further comprising applying a die coat over the one or more passivation layers.

49. A method as in claim 48, in which the die coat is polyimide.

50. A method as in claim 48, in which the die coat is applied to a thickness of approximately 8.0 to 12.0 microns.

51. A method as in claim 1, in which the source and drain regions in the substrate in each of the first and the second well regions, and the gate elements are interconnected to form a unit memory element.

52. A method as in claim 1 further comprising forming a stacked capacitor over one of the first and second well regions.

53. A method as in claim 1, further comprising the step of:

prior to forming the silicon nitride layer on the surface of the semiconductor substrate, forming a thin silicon dioxide pad layer on the surface of the semiconductor substrate;

in which the first dopant is implanted into the substrate through the pad layer.

54. A method as in claim 53, further comprising the step of, after implanting the second dopant, stripping all silicon dioxide from the surface of the substrate.

55. A method as in claim 53, in which the pad layer is formed to a thickness of approximately 800 to 3,000 Angstroms.

56. A method as in claim 1, further comprising the step of, after implanting the second dopant, stripping all silicon dioxide from the surface of the substrate.

57. A method as in claim 56, further comprising the step of, after stripping all silicon dioxide from the surface of the substrate, forming a thin silicon dioxide pad layer on the surface of the substrate.

58. A method as in claim 1, in which the silicon nitride layer is formed to a thickness of approximately 1,000 to 10,000 Angstroms.

59. A method as in claim 1, in which the first silicon dioxide layer is grown in an oxygen furnace.

60. A method as in claim 59, in which the first silicon dioxide layer is grown by placing the substrate into the oxygen furnace and maintaining the furnace at a temperature of 1,000° C. to 1,100° C. for approximately 10 hours.

61. A method as in claim 1, in which the device is a CMOS device.

* * * * *